US012603599B2

(12) United States Patent      (10) Patent No.:    US 12,603,599 B2

Hnayno et al.                   (45) Date of Patent:     Apr. 14, 2026

---

(54) COOLING ARRANGEMENT IMPLEMENTING A PHOTOVOLTAIC DEVICE

(71) Applicant: OVH, Roubaix (FR)

(72) Inventors: Mohamad Hnayno, Roubaix (FR); Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 292 days.

(21) Appl. No.: 18/588,685

(22) Filed: Feb. 27, 2024

(65) Prior Publication Data

US 2024/0305236 A1     Sep. 12, 2024

(30) Foreign Application Priority Data

Mar. 9, 2023    (EP) .................................... 23305320

(51) Int. Cl.
     *H02S 10/30*        (2014.01)
     *H05K 7/20*         (2006.01)

(52) U.S. Cl.
     CPC ......... *H02S 10/30* (2014.12); *H05K 7/20263* (2013.01); *H05K 7/20772* (2013.01); *H05K 7/20781* (2013.01)

(58) Field of Classification Search
     CPC .......... H05K 7/20236; H05K 7/20272; H05K 7/20772; H05K 7/20781; H05K 7/203; H05K 7/20263; H05K 7/20327; H05K 7/20818; H05K 7/1487; H05K 7/20281; H05K 7/20736; H05K 7/208; H05K 7/20809; H05K 7/20936; G06F 1/20;

(Continued)

(56) References Cited

U.S. PATENT DOCUMENTS

| | | | |
|---|---|---|---|
| 5,119,021 A * | 6/1992 | Taraci | .................... G05D 23/01 |
| | | | 165/80.4 |
| 11,729,950 B2 * | 8/2023 | Chehade | ................ H05K 7/208 |
| | | | 361/699 |

(Continued)

FOREIGN PATENT DOCUMENTS

| | | |
|---|---|---|
| EP | 4068932 A1 | 10/2022 |
| ES | 2529266 B2 | 2/2016 |

(Continued)

OTHER PUBLICATIONS

European Search Report issued by the European Patent Office (EPO) on Oct. 23, 2023 in connection with European patent application No. 23305320.6, 5 pages.

*Primary Examiner* — Michael A Matey

(74) *Attorney, Agent, or Firm* — BCF LLP

(57)           ABSTRACT

A cooling system and a method for cooling an electronic device are disclosed. The electronic device includes a heat-generating component. The cooling arrangement includes an immersion casing that contains a dielectric cooling liquid, the electronic device being, at least in part, immersed in the dielectric cooling liquid such that the dielectric cooling liquid collects, in use, at least a first portion of a thermal energy generated by the heat-generating component, and a photovoltaic device proximate to the immersion casing and configured to convert at least in part a second portion of the thermal energy generated by the heat-generating component into electric energy, the second portion having radiated from the dielectric cooling liquid and through the immersion casing.

18 Claims, 8 Drawing Sheets

(58) Field of Classification Search
CPC .... G06F 2200/201; G06F 1/183; G06F 1/206;
F28F 23/00; H02S 40/345; H02S 10/30;
Y02E 10/50
See application file for complete search history.

(56) References Cited

U.S. PATENT DOCUMENTS

| | | | | |
|---|---|---|---|---|
| 11,924,998 | B2 * | 3/2024 | Hnayno | H05K 7/20236 |
| 12,004,321 | B2 * | 6/2024 | Moon | H05K 7/20236 |
| 12,137,536 | B2 * | 11/2024 | Meneboo | H05K 7/20272 |
| 12,144,145 | B2 * | 11/2024 | Chehade | H01L 23/3672 |
| 2013/0107601 | A1 * | 5/2013 | Wagoner | H01L 23/427 |
| | | | | 363/141 |
| 2018/0027695 | A1 * | 1/2018 | Wakino | H05K 7/20772 |
| | | | | 361/699 |
| 2019/0383559 | A1 * | 12/2019 | Aoki | F28D 1/05316 |
| 2020/0113083 | A1 * | 4/2020 | Schon | H05K 7/20327 |
| 2022/0338376 | A1 * | 10/2022 | Tan | H05K 7/20818 |
| 2023/0112841 | A1 * | 4/2023 | Juhasz | H05K 7/20318 |
| | | | | 361/700 |
| 2023/0400398 | A1 * | 12/2023 | Mcfarlane, Jr. | H05K 7/203 |

FOREIGN PATENT DOCUMENTS

| | | | |
|---|---|---|---|
| FR | 3087083 | A1 | 4/2020 |
| WO | 2022208403 | A1 | 10/2022 |

* cited by examiner

100

106          108          102

104

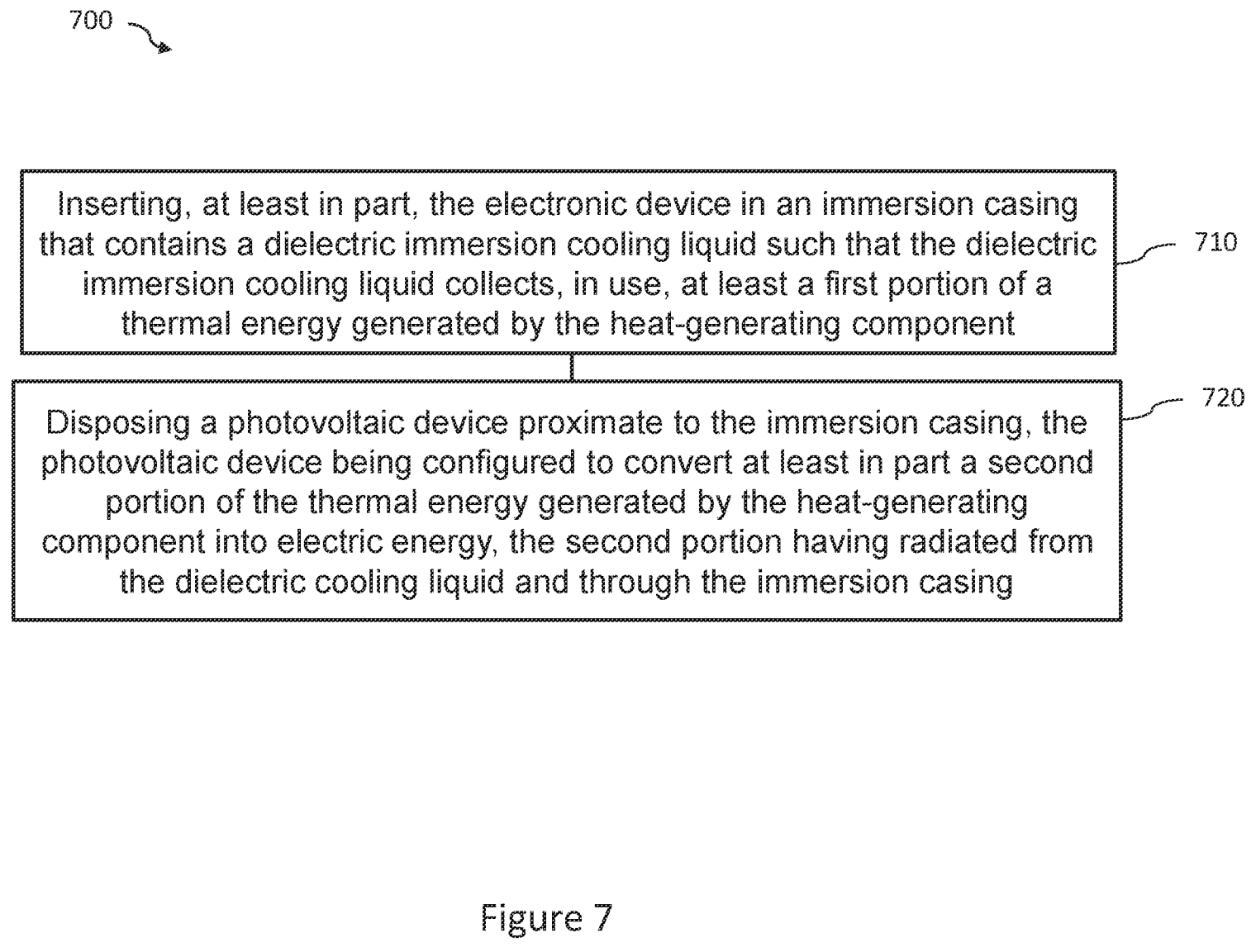

700

710

Inserting, at least in part, the electronic device in an immersion casing that contains a dielectric immersion cooling liquid such that the dielectric immersion cooling liquid collects, in use, at least a first portion of a thermal energy generated by the heat-generating component

720

Disposing a photovoltaic device proximate to the immersion casing, the photovoltaic device being configured to convert at least in part a second portion of the thermal energy generated by the heat-generating component into electric energy, the second portion having radiated from the dielectric cooling liquid and through the immersion casing

Figure 7

COOLING ARRANGEMENT IMPLEMENTING A PHOTOVOLTAIC DEVICE

CROSS REFERENCE

The present application claims priority to EP application Ser. No. 23/305,320.6, filed Mar. 9, 2023 entitled "COOLING ARRANGEMENT IMPLEMENTING A PHOTOVOLTAIC DEVICE", the entirety of which is incorporated herein by reference.

FIELD OF TECHNOLOGY

The present technology relates to cooling systems for cooling of electronic components. In particular, a cooling arrangement implementing a photovoltaic device is disclosed.

BACKGROUND

Electronic equipment, for example servers, memory banks, computer discs, and the like, is conventionally grouped in equipment racks. Large data centers and other large computing facilities may contain thousands of racks supporting thousands or even tens of thousands of servers.

The racks, including equipment mounted in their backplanes, consume large amounts of electric power and generate significant amounts of thermal energy. Cooling needs are important in such racks. Some electronic devices, such as processors, generate so much heat that they could fail within seconds in case of a lack of cooling.

Various cooling measures have been implemented to address the thermal energy generated by the electronic assemblies. One such measure provides an immersion cooling configuration, in which the heat-generating electronic components of electronic assemblies are submerged in a container that is at least partially filled with a non-conducting cooling fluid, such as, for example, an oil-based dielectric cooling fluid. In this manner efficient thermal contact and heat transfer is achieved between the heat-generating electronic components and the cooling dielectric cooling fluid.

However, it has been observed that a portion of the thermal energy may still be released in an environment of the racks, even in the presence of cooling systems. A more sustainable cooling arrangement may thus be desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Implementations of the present technology have been developed based on developers' appreciation of shortcomings associated with the prior art.

In particular, such shortcomings may comprise (1) deficiencies to optimize heat absorption; and/or (2) significant power consumption of the cooling systems.

In one aspect, various implementations of the present technology provide a cooling arrangement for cooling an electronic device, the electronic device including a heat-generating component. The cooling arrangement includes an immersion casing that contains a dielectric cooling liquid, the electronic device being, at least in part, immersed in the dielectric cooling liquid such that the dielectric cooling liquid collects, in use, at least a first portion of a thermal energy generated by the heat-generating component and a photovoltaic device proximate to the immersion casing and configured to convert at least in part a second portion of the thermal energy generated by the heat-generating component into electric energy, the second portion having radiated from the dielectric cooling liquid and through the immersion casing.

In some non-limiting implementations, the photovoltaic device comprises a thermal energy collecting surface oriented toward the immersion casing.

In some non-limiting implementations, a shape of the thermal energy collecting surface matches at least a portion of an external side of the immersion casing.

In some non-limiting implementations, the thermal energy collecting surface is a planar surface extending parallel to a side of the immersion casing.

In some non-limiting implementations, the immersion casing is made of a metallic material.

In some non-limiting implementations, the immersion casing is made of aluminum.

In some non-limiting implementations, the photovoltaic device is disposed proximate to an upper portion of the immersion casing.

In some non-limiting implementations, the photovoltaic device is further configured to transmit the electric energy to an energy storage device.

In some non-limiting implementations, the photovoltaic device is further configured to transmit the electric energy to the electronic device.

In some non-limiting implementations, the photovoltaic device is further configured to transmit the electric energy to another electric device.

In some non-limiting implementations, the electronic device is a server.

In some non-limiting implementations, the immersion casing is mounted in rack of a datacenter, the photovoltaic device being configured to be mounted in the rack.

In a second broad aspect, the present technology provides a rack system comprising a plurality of cooling arrangements.

In a third broad aspect, the present technology provides a method for cooling an electronic device, the electronic device including a heat-generating component. The method includes inserting, at least in part, the electronic device in an immersion casing that contains a dielectric cooling liquid such that the dielectric cooling liquid collects, in use, at least a first portion of a thermal energy generated by the heat-generating component and disposing a photovoltaic device proximate to the immersion casing and configured to convert at least in part a second portion of the thermal energy generated by the heat-generating component into electric energy, the second portion having radiated from the dielectric cooling liquid and through the immersion casing.

In some non-limiting implementations, disposing a photovoltaic device proximate to the immersion casing comprises orienting a thermal energy collecting surface thereof toward the immersion casing.

In some non-limiting implementations, a shape of the thermal energy collecting surface matches at least a portion of an external side of the immersion casing.

In some non-limiting implementations, the thermal energy collecting surface is a planar surface extending parallel to a side of the immersion casing.

In some non-limiting implementations, the immersion casing is made of a metallic material.

In some non-limiting implementations, the immersion casing is made of aluminum.

In some non-limiting implementations, disposing the photovoltaic device proximate to the immersion casing comprises disposing proximate to an upper portion of the immersion casing.

In some non-limiting implementations, the method further includes storing the electric energy in an energy storage device.

In some non-limiting implementations, the method further includes transmitting the electric energy to the electronic device.

In some non-limiting implementations, the method further includes transmitting the electric energy to another electric device.

In some non-limiting implementations, the electronic device is a server.

In some non-limiting implementations, the immersion casing is mounted in a rack system of a datacenter, the photovoltaic device being configured to be mounted in the rack system.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 7 is a flow diagram showing operations of a method for cooling an electronic device of the electronic assembly of FIG. 3 in accordance with some embodiments of the present technology.

Figure 1:
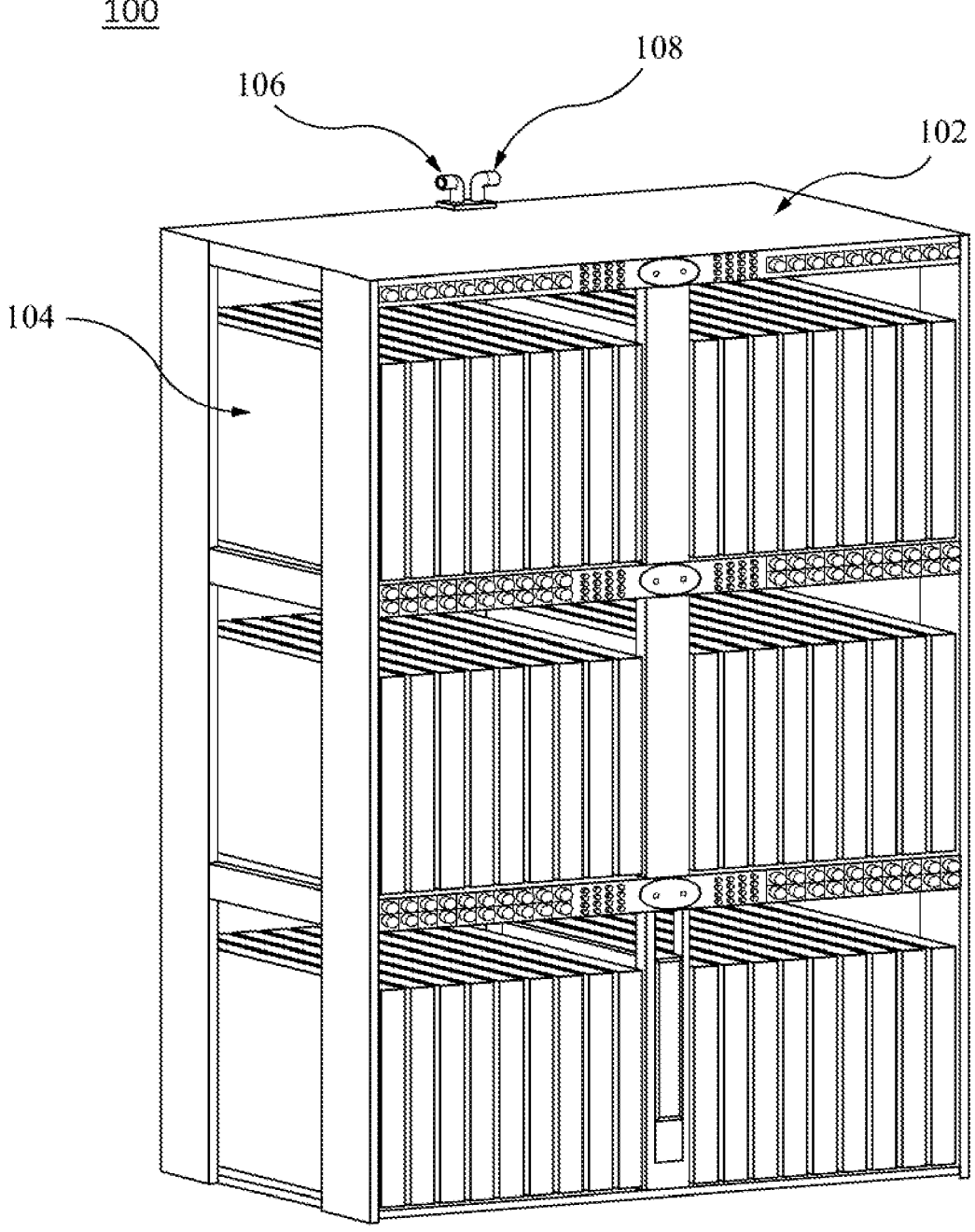
FIG. 1 shows a perspective view of a rack system for housing numerous electronic assemblies.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative systems embodying the principles of the present technology.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

With these fundamentals in place, we will now consider some non-limiting examples to illustrate various implementations of aspects of the present technology. FIG. 1 shows a perspective view of a rack system 100 for housing numerous rack-mounting assemblies 104. As shown, the rack system 100 may include a rack frame 102, rack-mounting assemblies 104, a liquid cooling inlet conduit 106 and a liquid cooling outlet conduit 108. As described more fully below, the rack-mounting assemblies 104 may be oriented vertically with respect to the rack frame 102, resembling books on a library shelf. This arrangement may provide for mounting a large number of such rack-mounting assemblies 104 in the rack frame 102, relative to conventional arrangements, particularly with respect to conventional arrangements of immersion-cooled rack-mounted assemblies.

Figure 2:
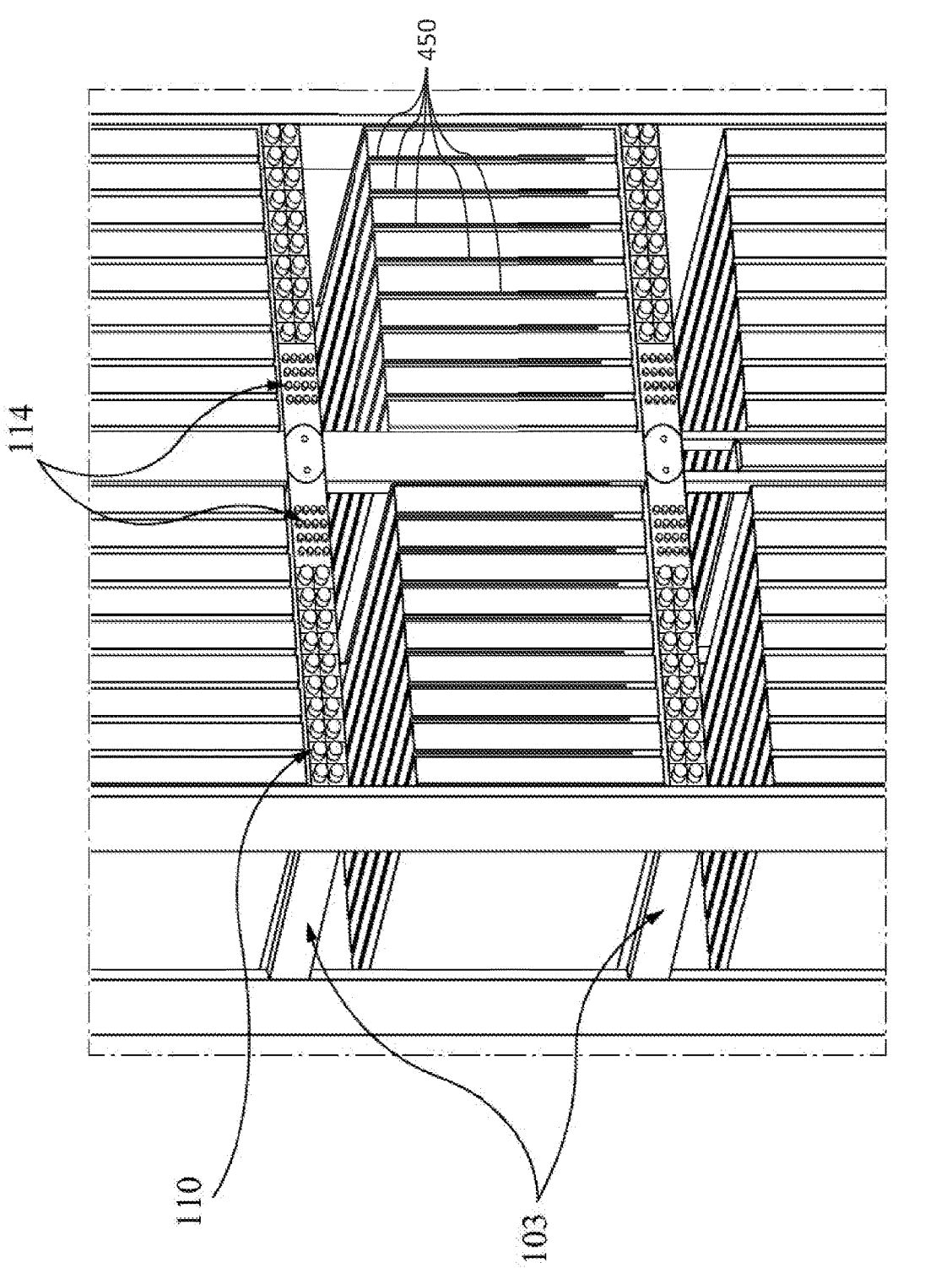
FIG. 2 shows another perspective view of the rack system of FIG. 1.

FIG. 2 shows another perspective view of the rack system 100. As shown, the rack system 100 may further comprise a power distribution unit 110 and liquid coolant inlet/outlet connectors 114. It is to be noted that the rack system 100 may include other components such as heat exchangers, cables, pumps or the like, however, such components have been omitted from FIGS. 1 and 2 for clarity of understanding. As shown in FIGS. 1 and 2, the rack frame 102 may include shelves 103 to accommodate one or more rack-mounting assemblies 104. As noted above, the one or more rack-mounting assemblies 104 may be arranged vertically with respect to the shelves 103. In some embodiments, guide members (not shown) may be used on the shelves 103 to guide the rack-mounting assemblies 104 into position during racking and de-racking, and to provide proper spacing between the rack-mounting assemblies 104 for racking and de-racking.

Photovoltaic devices 450 (FIG. 4) are also provided in the rack frame 102 and interleaved between the rack-mounting assemblies 104. In use, the photovoltaic devices 450 may collect a portion of thermal energy generated in the rack-mounting assemblies 104 and convert the collected thermal energy into electric energy. A photovoltaic device 450 is described in greater details herein after.

Figure 3:
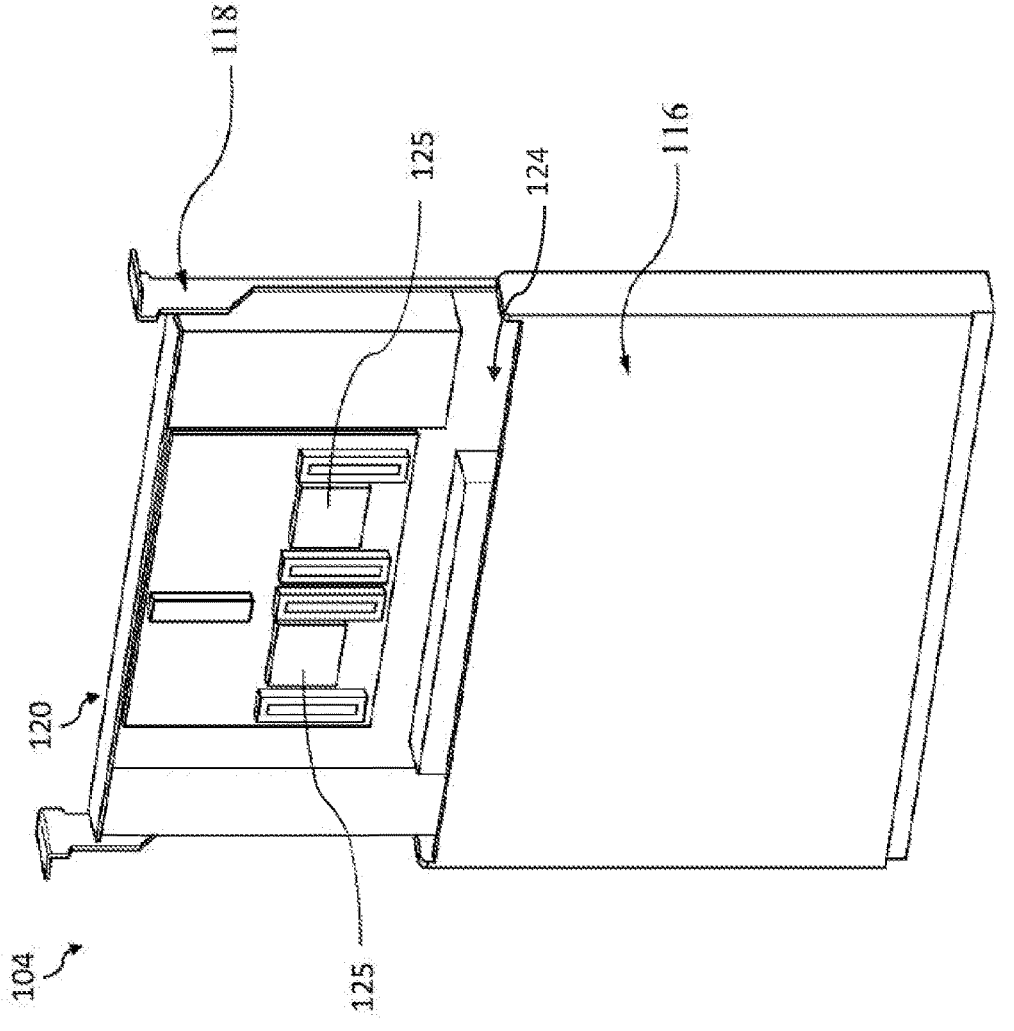
FIG. 3 shows a perspective view of an electronic assembly.

FIG. 3 shows a perspective view of the rack-mounted assembly 104. As shown, the rack-mounted assembly 104 includes a detachable frame, or "board" 118 of an electronic device 120, and an immersion case 116. The board 118 holds electronic components 125 of the electronic device 120 and may be immersed in the immersion case 116. Although the immersion case 116, board 118, and electronic components 125 are shown as separate parts, it will be understood by one of ordinary skill in the art that, in some embodiments, two or more of these components could be combined. For example, the electronic components 125 could be fixed directly on the board 118 and/or the immersion case 116. In an implementation, the immersion case 116 is made of a metallic material such as, for example and without limitations, aluminum.

It is contemplated that the electronic devices 120 may generate a significant amount of heat. For example and without limitations, the electronic device 120 may be a server. Consequently, the rack system 100 may use a cooling system to cool down the electronic devices 120 to prevent the electronic devices 120 from being damaged. In an embodiment, the cooling system may be a hybrid cooling system including an immersion cooling system and a channelized cooling system.

As used herein, an immersion cooling system is a cooling system in which the electronic device is in direct contact with a non-conductive (dielectric) cooling liquid, which either flows over at least portions of the electronic device, or in which at least portions of the electronic device are submerged. For example, in the rack-mounted assembly 104, the immersion case 116 may contain a dielectric cooling liquid (not shown in FIG. 3). Further, the board 118 including the electronic components 125 may be submerged at least in part in the immersion cooling case 116. In some embodiments, the dielectric cooling liquid and the board 118 may be inserted into the immersion case 116 via an opening 124 at the top of the immersion case 116. In some embodiments, the opening 124 may remain at least partially open during operation of the electronic device 120, providing a non-sealed configuration for the immersion case 116. Such non-sealed configurations may be easier to manufacture and maintain than sealed configurations, but may be inappropriate for, e.g., two-phase systems, in which the immersion cooling liquid may boil during operation of the electronic device 120.

In some embodiments, the immersion case 116 may also include structures or devices for cooling the dielectric cooling liquid. For example, a convection-inducing structure, such as a serpentine convection coil (not shown) in which a flow of cooling liquid (e.g. water) is maintained may be used to cool the dielectric cooling liquid via natural convection.

Alternatively or additionally, a pump (not shown) may be used to circulate the dielectric cooling liquid either within the immersion case 116 or through an external cooling system (not shown). In some embodiments, a two-phase system in which dielectric cooling liquid in a gaseous phase is cooled by condensation may be used. Generally, any technology or combination for cooling the dielectric cooling liquid may be used without departing from the principles disclosed herein.

In the same or other implementations, a channelized cooling system may further be provided to cool heat-generating components of the electronic device 120 (i.e. the electronic components 125) using one or more liquid cooling units, which may also be called "cold plates" or "water blocks" (although a liquid circulating through the "water blocks" may be any of a wide variety of known thermal transfer liquids, rather than water). Examples of heat-generating components that may be cooled using such a thermal transfer device include, but are not limited to, central processing units (CPUs), graphics processing units (GPUs), neural processing units (NPUs), tensor processing units (TPUs), power supply circuitry, and application specific integrated circuits (ASICs), including, for example, ASICs configured for high-speed cryptocurrency mining.

Figure 4:
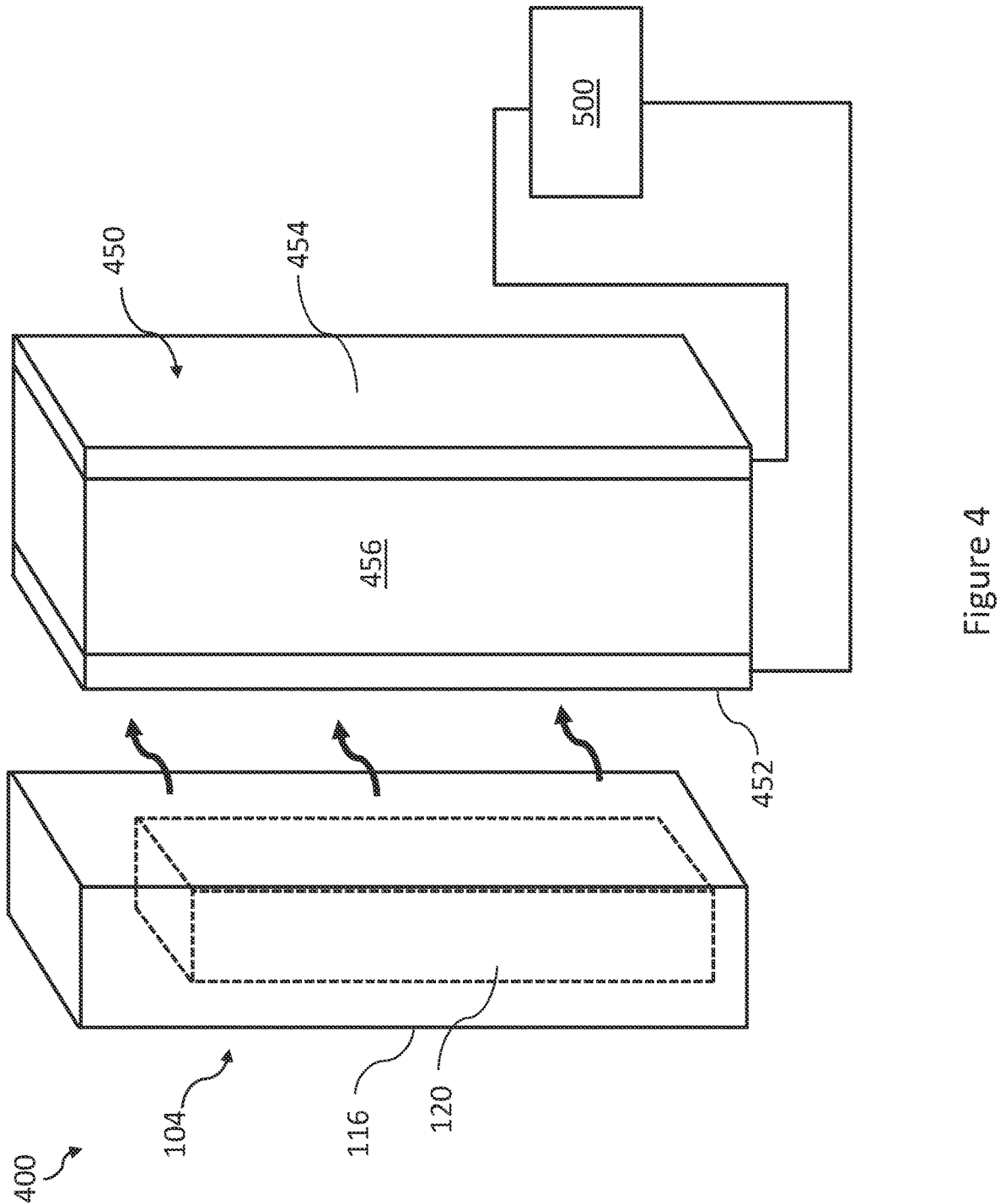
FIG. 4 shows a schematic diagram of a cooling arrangement for the electronic assembly in accordance some non-limiting implementations of the present technology.

As depicted on FIG. 4, the present disclosure describes a cooling arrangement 400 for cooling of the electronic device 120. In this implementation, the cooling arrangement 400 includes a photovoltaic device 450 and the immersion casing 116 that receives the heat-transfer liquid and the electronic device 120 therein.

In use, the photovoltaic device 450 is disposed at a distance proximate to the immersion casing 116 and converts at least in part a portion of the thermal energy radiated through the immersion casing 116 into electric energy. For example and without limitation, a thermal energy collecting surface 452 of the photovoltaic device 450 may be based on a size of the immersion casing 116. The thermal energy collecting surface 452 may range between a few square millimetres and a few square centimeters. More specifically, the photovoltaic device 450 is a thermophotovoltaic device that may produce electricity by collecting infrared wavelengths associated with the thermal energy radiating through the immersion casing 116 and subsequently converts the infrared wavelengths into electron-hole pairs within a thermophotovoltaic (TPV) medium 456. These electron-hole pairs can be conducted to leads within the photovoltaic device 450 to produce an electric current. The TPV medium may be made for example of Ge, GaSb, GaAsInSb or any suitable semiconductor material. The range of photovoltaic conversion wavelength of the TPV medium 456 is adapted to the infrared wavelengths emitted by the immersion casing 116. In use, the photovoltaic devices 450 may be fixedly attached to the rack frame 102 (e.g. connected to a mounting structure that is mounted onto the rack frame 102).

In this implementation, the thermal energy collecting surface 452 is oriented toward the immersion casing 116 to receive thermal entry therefrom, and a back surface 454. Electric current generated by the photovoltaic device 450 may further be directed to an electric load 500 connected to the thermal energy collecting surface 452 and to the back surface 454. The electric load 500 may be, for example and without limitation, an energy storage device (e.g. battery) or any other electric device. For example, electric energy generated by the photovoltaic device 450 may be used to power one or more fans installed in a datacenter hosting the rack system 100, and/or a pump of the immersion cooling system disclosed herein.

In some implementations, a shape of the thermal energy collecting surface 452 matches at least a portion of an external side of the immersion casing 116. For example, the thermal energy collecting surface 452 may be a planar surface and extends parallel to a side of the immersion casing 116 as depicted in FIG. 4. As another example, the thermal energy collecting surface 452 may have a curved shaped to match a curved-shape immersion casing 116. In the illustrative implementation of FIG. 4, the external surface of the immersion casing 116 is a planar surface.

Figure 5:
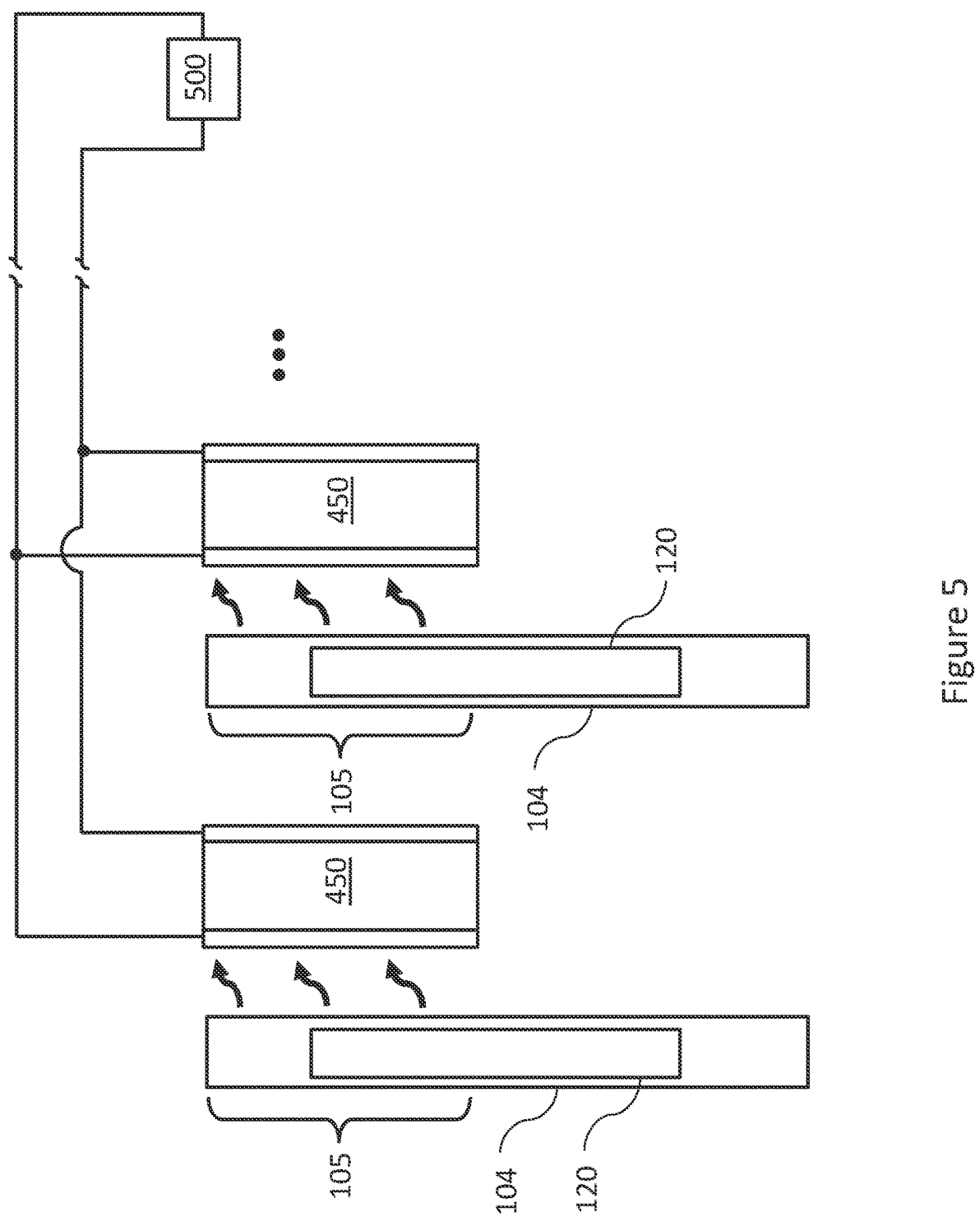
FIG. 5 shows a schematic diagram of a cooling arrangement for a plurality of electronic assemblies in accordance some non-limiting implementations of the present technology.

In some implementations and as depicted in FIG. 5, the photovoltaic device 450 may be disposed proximate to an upper portion 105 of the immersion casing 116. This may increase a conversion ratio of the photovoltaic device 450, given that a distribution of thermal energy radiating through the immersion casing 116 may provide a higher amount of radiated thermal energy at the upper portion 105 compared to a lower portion of the immersion casing 116.

By using immersive cooling collaboratively with the photovoltaic device 450 to cool the electronic devices 120, an in-use temperature of the dielectric cooling liquid may be higher than ambient air temperature due to its high heat capacity. Amount of radiated thermal energy that may be collected is thus increased. Using the immersion cooling system disclosed herein and the corresponding dielectric cooling liquid, the thermal radiation may be more concentrated on the walls of the immersion casing 116, thereby making the collection by the photovoltaic device 450 more efficient.

As shown in FIG. 5, each immersion casing 116 and thus each rack-mounting assembly 104 may be associated with a corresponding photovoltaic device 450 for collecting a portion of thermal energy thereof. As a result, the photovoltaic devices 450 may participate in collecting thermal energy generated by the electronic devices 120 and radiated through corresponding immersion casings 116, and thus reduce a temperature in a vicinity of the electronic devices 120. Broadly speaking, the cooling arrangement 400 may cool the electronic devices 120 through the immersion cooling described above, and by collecting radiated thermal energy by the photovoltaic device 450.

Figure 6:
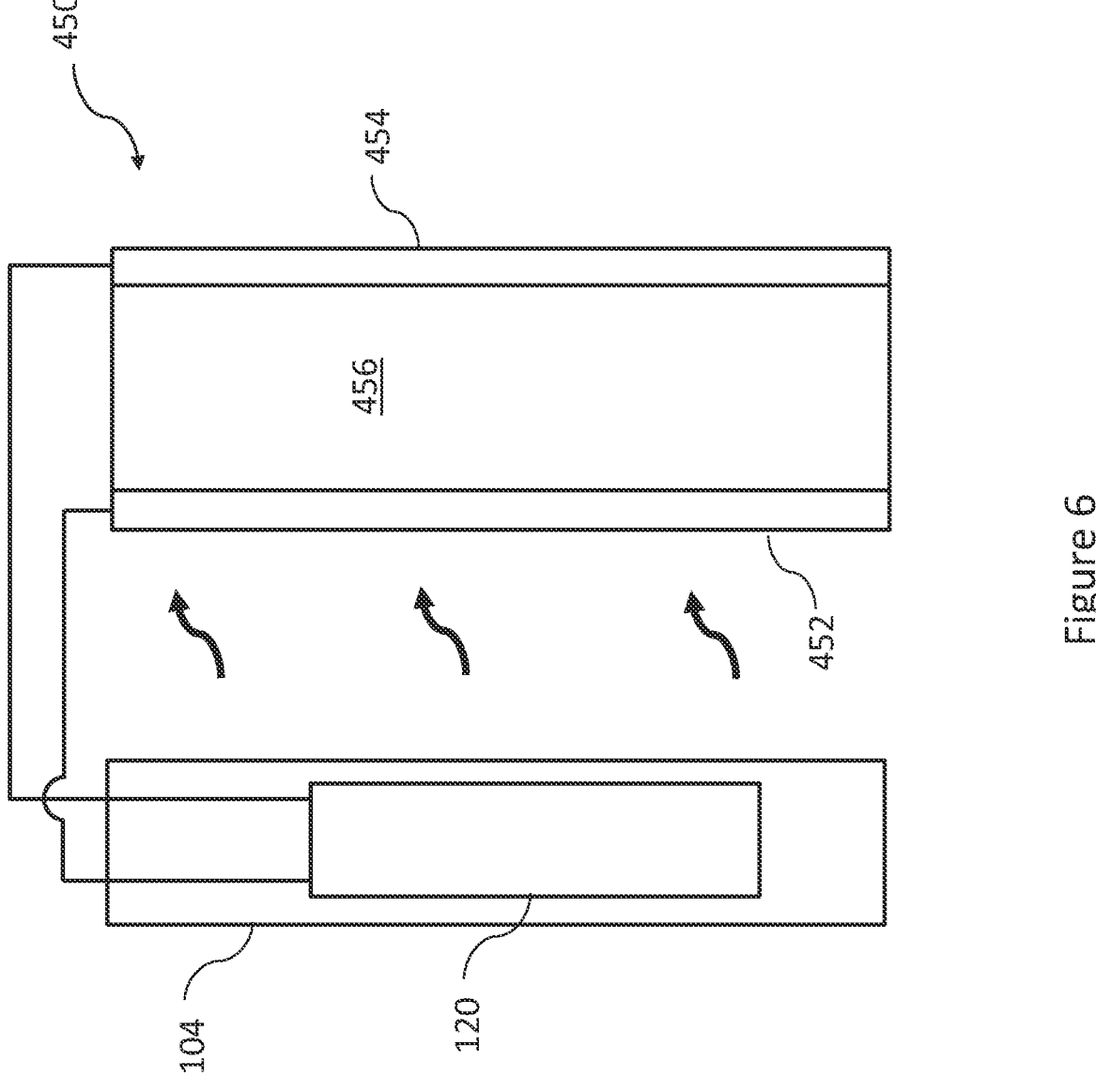
FIG. 6 shows a schematic diagram of a cooling arrangement for the electronic assembly in accordance some other non-limiting implementations of the present technology.

In some implementations, some of the photovoltaic devices 450 may collaborate to convey electric energy to a same electric load 500 as depicted in FIG. 5. In some other implementations, each photovoltaic device 450 may provide electric energy to a single corresponding electric load 500. In the same or other implementations, electric energy generated by the photovoltaic device 450 may be directed to the electronic device 120 (i.e. the electronic components 122) of the rack-mounting assembly 104 from which thermal energy has been collected by the photovoltaic device 450, as depicted in FIG. 6.

Summarily, the cooling arrangement 400 may provide sustainable cooling to the electronic device 120 by reusing thermal energy radiated through the immersion casing in the form of usable electric energy.

Figure 8:
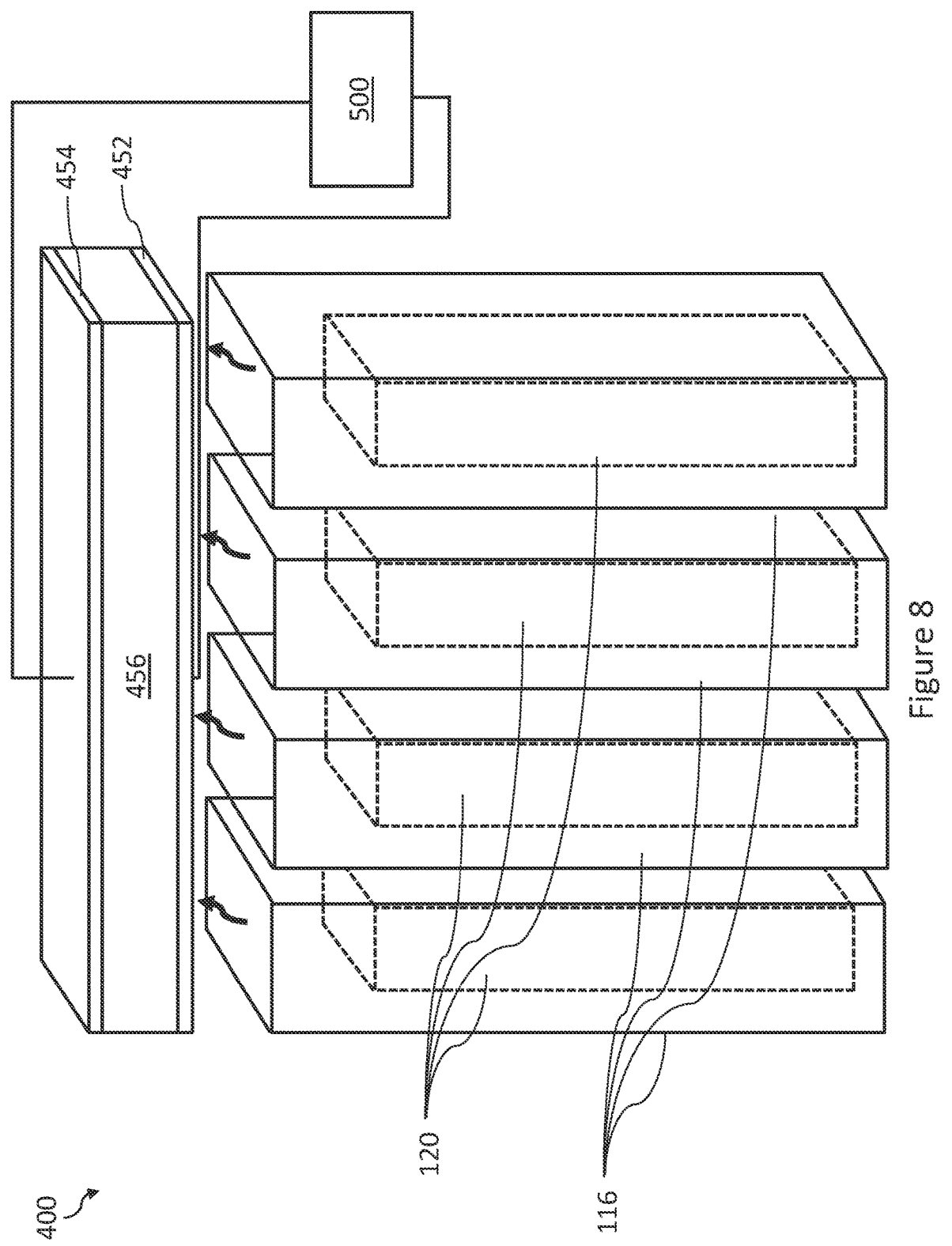
FIG. 8 shows a schematic diagram of a cooling arrangement for a plurality of electronic assemblies in accordance some other non-limiting implementations of the present technology.

Even though the photovoltaic devices 450 are located on a longitudinal side of the electronic devices 120, it is contemplated that the photovoltaic devices 450 may be disposed on any side (e.g. front side, rear side) of the electronic devices 120. For example, FIG. 8 illustrates an implementation where a photovoltaic device 450 is disposed above a plurality of corresponding electronic devices 120, facing top sides thereof. A size of the photovoltaic device 450 may be adapted such that a single photovoltaic device 450 may be disposed above a corresponding single electronic devices 120.

FIG. 7 is a flow diagram of a method 700 for cooling an electronic device, such as the electronic device 120, the electronic device including a heat-generating component (e.g. the electronic component 122) according to some implementations of the present technology. Some steps or portions of steps in the flow diagram may be omitted or changed in order.

The method 700 starts with inserting, at operation 710, at least in part, the electronic device in an immersion casing that contains a dielectric cooling liquid such that the dielectric cooling liquid collects, in use, at least a first portion of a thermal energy generated by the heat-generating component. The electronic device may be, for example and without limitations, a server. In some implementations, the immersion casing may be made of a metallic material such as aluminum.

In some implementations, the immersion casing may be mounted in a rack system, such as the rack system 100, of a datacenter, the photovoltaic device being mounted in the rack system.

The method ends with disposing, at operation 720, a photovoltaic device, such as the photovoltaic device 450, proximate to the immersion casing. In use, the photovoltaic device converts at least in part a second portion of the thermal energy generated by the heat-generating component into electric energy, the second portion having radiated from the dielectric cooling liquid and through the immersion casing. In some implementations, the photovoltaic device may be oriented such that a thermal energy collecting surface thereof is oriented toward the immersion casing.

In some implementations, the photovoltaic device is disposed proximate to an upper portion of the immersion casing. This may help to increase a conversion ratio of generated electric energy over the received thermal energy for the photovoltaic device.

In the same or other implementations, a shape of thermal energy collecting surface matches at least a portion of an external side of the immersion casing. This may help in increasing the conversion ratio of the photovoltaic device.

For example, the thermal energy collecting surface may be a planar surface extending parallel to a side of the immersion casing. As another example, the thermal energy collecting surface may be a planar surface and extends parallel to a side of the immersion casing.

In some implementations, the method 700 further includes storing the electric energy in an energy storage device, transmitting the electric energy to the electric device disposed in the immersion casing and/or transmitting the electric energy to another electric device. In implementations where the immersion casing is mounted in a rack system of a datacenter, said other electric device may be one or more fans of the datacenter.

While the above-described implementations have been described and shown with reference to particular operations performed in a particular order, it will be understood that these steps may be combined, sub-divided, or re-ordered without departing from the teachings of the present technology. At least some of the steps may be executed in parallel or in series. Accordingly, the order and grouping of the steps are not a limitation of the present technology.

It should be expressly understood that not all technical effects mentioned herein need to be enjoyed in each and every implementation of the present technology.

CLAUSES

[Clause 1] A cooling arrangement for cooling an electronic device, the electronic device including a heat-generating component, the cooling arrangement comprising:
an immersion casing that contains a dielectric cooling liquid, the electronic device being, at least in part, immersed in the dielectric cooling liquid such that the dielectric cooling liquid collects, in use, at least a first portion of a thermal energy generated by the heat-generating component; and
a photovoltaic device proximate to the immersion casing and configured to convert at least in part a second portion of the thermal energy generated by the heat-generating component into electric energy, the second portion having radiated from the dielectric cooling liquid and through the immersion casing.

[Clause 2] The cooling arrangement of clause 1, wherein the photovoltaic device comprises a thermal energy collecting surface oriented toward the immersion casing.

[Clause 3] The cooling arrangement of clause 2, wherein a shape of the thermal energy collecting surface matches at least a portion of an external side of the immersion casing.

[Clause 4] The cooling arrangement of clause 2 or 3, wherein the thermal energy collecting surface is a planar surface extending parallel to a side of the immersion casing.

[Clause 5] The cooling of any one of clauses 1 to 4, wherein the immersion casing is made of a metallic material.

[Clause 6] The cooling arrangement of clause 5, wherein the immersion casing is made of aluminum.

[Clause 7] The cooling arrangement of any one of clauses 1 to 6, wherein the photovoltaic device is disposed proximate to an upper portion of the immersion casing.

[Clause 8] The cooling arrangement of any one of clauses 1 to 7, wherein the photovoltaic device is further configured to transmit the electric energy to an energy storage device.

[Clause 9] The cooling arrangement of any one of clauses 1 to 7, wherein the photovoltaic device is further configured to transmit the electric energy to the electronic device.

[Clause 10] The cooling arrangement of any one of clauses 1 to 7, wherein the photovoltaic device is further configured to transmit the electric energy to another electric device.

[Clause 11] The cooling arrangement of any one of clauses 1 to 10, wherein the electronic device is a server.

[Clause 12] The cooling arrangement of any one of clauses 1 to 9, wherein the immersion casing is mounted in rack of a datacenter, the photovoltaic device being configured to be mounted in the rack.

[Clause 13] A rack system comprising a plurality of cooling arrangements in accordance with any one of clauses 1 to 12.

[Clause 14] A method for cooling an electronic device, the electronic device including a heat-generating component, the method comprising:
inserting, at least in part, the electronic device in an immersion casing that contains a dielectric cooling liquid such that the dielectric cooling liquid collects, in use, at least a first portion of a thermal energy generated by the heat-generating component; and
disposing a photovoltaic device proximate to the immersion casing and configured to convert at least in part a second portion of the thermal energy generated by the heat-generating component into electric energy, the second portion having radiated from the dielectric cooling liquid and through the immersion casing.

[Clause 15] The method of clause 14, wherein disposing a photovoltaic device proximate to the immersion casing comprises orienting a thermal energy collecting surface thereof toward the immersion casing.

[Clause 16] The method of clause 15, wherein a shape of the thermal energy collecting surface matches at least a portion of an external side of the immersion casing.

[Clause 17] The method of clause 15 or 16, wherein the thermal energy collecting surface is a planar surface extending parallel to a side of the immersion casing.

[Clause 18] The method of any one of clauses 15 to 17, wherein the immersion casing is made of a metallic material.

[Clause 19] The method of clause 18, wherein the immersion casing is made of aluminum.

[Clause 20] The method of any one of clauses 15 to 17, wherein disposing the photovoltaic device proximate to the immersion casing comprises disposing proximate to an upper portion of the immersion casing.

[Clause 21] The method of any one of clauses 15 to 20, further comprising storing the electric energy in an energy storage device.

[Clause 22] The method of any one of clauses 15 to 20, further comprising transmitting the electric energy to the electronic device.

[Clause 23] The method of any one of clauses 15 to 20, further comprising transmitting the electric energy to another electric device.

[Clause 24] The method of any one of clauses 15 to 22, wherein the electronic device is a server.

[Clause 25] The method of any one of clauses 15 to 24, wherein the immersion casing is mounted in a rack system of a datacenter, the photovoltaic device being configured to be mounted in the rack system.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling arrangement for cooling an electronic device, the electronic device including a heat-generating component, the cooling arrangement comprising:

an immersion casing that contains a dielectric cooling liquid, the electronic device being, at least in part, immersed in the dielectric cooling liquid such that the dielectric cooling liquid collects, in use, at least a first portion of a thermal energy generated by the heat-generating component; and a photovoltaic device proximate to the immersion casing and configured to convert at least in part a second portion of the thermal energy generated by the heat-generating component into electric energy, the second portion having radiated from the dielectric cooling liquid and through the immersion casing.

2. The cooling arrangement of claim 1, wherein the photovoltaic device comprises a thermal energy collecting surface oriented toward the immersion casing.

3. The cooling arrangement of claim 2, wherein a shape of the thermal energy collecting surface matches at least a portion of an external side of the immersion casing.

4. The cooling arrangement of claim 1, wherein the immersion casing is made of a metallic material.

5. The cooling arrangement of claim 1, wherein the photovoltaic device is disposed proximate to an upper portion of the immersion casing.

6. The cooling arrangement of claim 1, wherein the photovoltaic device is further configured to transmit the electric energy to an energy storage device.

7. The cooling arrangement of claim 1, wherein the photovoltaic device is further configured to transmit the electric energy to the electronic device.

8. A rack system comprising a plurality of cooling arrangements in accordance with claim 1.

9. A method for cooling an electronic device, the electronic device including a heat-generating component, the method comprising:

inserting, at least in part, the electronic device in an immersion casing that contains a dielectric cooling liquid such that the dielectric cooling liquid collects, in use, at least a first portion of a thermal energy generated by the heat-generating component; and disposing a photovoltaic device proximate to the immersion casing and configured to convert at least in part a second portion of the thermal energy generated by the heat-generating component into electric energy, the second portion having radiated from the dielectric cooling liquid and through the immersion casing.

10. The method of claim 9, wherein disposing a photovoltaic device proximate to the immersion casing comprises orienting a thermal energy collecting surface thereof toward the immersion casing.

11. The method of claim 10, wherein a shape of the thermal energy collecting surface matches at least a portion of an external side of the immersion casing.

12. The method of claim 9, wherein the immersion casing is made of a metallic material.

13. The method of claim 9, wherein disposing the photovoltaic device proximate to the immersion casing comprises disposing proximate to an upper portion of the immersion casing.

14. The method of claim 9, further comprising storing the electric energy in an energy storage device.

15. The method of claim 9, further comprising transmitting the electric energy to the electronic device.

16. A cooling arrangement for cooling an electronic device, the electronic device including a heat-generating component, the cooling arrangement comprising:

an immersion casing arranged to contain a dielectric cooling liquid, the electronic device being, at least in part, immersed in the dielectric cooling liquid, in use, a photovoltaic device positioned to convert thermal energy from the heat-generating component.

17. The cooling arrangement of claim 16, wherein the photovoltaic device is external to the immersion casing.

18. The cooling arrangement of claim 16, wherein the photovoltaic device is disposed proximate to the immersion casing.

* * * * *